United States Patent
You et al.

(10) Patent No.: US 12,543,547 B2
(45) Date of Patent: *Feb. 3, 2026

(54) METHOD OF DIELECTRIC MATERIAL FILL AND TREATMENT

(71) Applicant: APPLIED MATERIALS, INC., Santa Clara, CA (US)

(72) Inventors: Shi You, San Jose, CA (US); He Ren, San Jose, CA (US); Naomi Yoshida, Sunnyvale, CA (US); Nikolaos Bekiaris, Campbell, CA (US); Mehul Naik, San Jose, CA (US); Martin Jay Seamons, San Jose, CA (US); Jingmei Liang, Santa Clara, CA (US); Mei-Yee Shek, Palo Alto, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/781,633

(22) Filed: Jul. 23, 2024

(65) Prior Publication Data

US 2024/0379420 A1    Nov. 14, 2024

Related U.S. Application Data

(63) Continuation of application No. 18/108,338, filed on Feb. 10, 2023, now Pat. No. 12,046,508, which is a
(Continued)

(51) Int. Cl.
| | | |
|---|---|---|
| H01L 21/768 | (2006.01) | |
| H01L 21/02 | (2006.01) | |
| H01L 21/67 | (2006.01) | |

(52) U.S. Cl.
CPC .. H01L 21/76837 (2013.01); H01L 21/02323 (2013.01); H01L 21/02337 (2013.01);
(Continued)

(58) Field of Classification Search
CPC ......... H01L 21/76826; H01L 21/76828; H01L 21/76834; H01L 21/76837; H01L 21/76885
See application file for complete search history.

(56) References Cited

U.S. PATENT DOCUMENTS

| | | |
|---|---|---|
| 6,673,718 B1 | 1/2004 | Lee et al. |
| 7,732,297 B2 | 6/2010 | Cho et al. |
| (Continued) | | |

OTHER PUBLICATIONS

Supplementary European Search Report for EP 21 78 9425 dated Apr. 12, 2024.
(Continued)

*Primary Examiner* — Daniel Luke
(74) *Attorney, Agent, or Firm* — Moser Taboada

(57) ABSTRACT

Embodiments herein provide for oxygen based treatment of low-k dielectric layers deposited using a flowable chemical vapor deposition (FCVD) process. Oxygen based treatment of the FCVD deposited low-k dielectric layers desirably increases the Ebd to capacitance and reliability of the devices while removing voids. Embodiments include methods and apparatus for making a semiconductor device including: etching a metal layer disposed atop a substrate to form one or more metal lines having a top surface, a first side, and a second side; depositing a passivation layer atop the top surface, the first side, and the second side under conditions sufficient to reduce or eliminate oxygen contact with the one or more metal lines; depositing a flowable layer of low-k dielectric material atop the passivation layer in a thickness sufficient to cover the one or more metal lines; and contacting the flowable layer of low-k dielectric material with oxygen under conditions sufficient to anneal and increase a density of the low-k dielectric material.

16 Claims, 7 Drawing Sheets

Related U.S. Application Data continuation of application No. 16/848,784, filed on Apr. 14, 2020, now Pat. No. 11,615,984.

(52) U.S. Cl.
CPC .. *H01L 21/67103* (2013.01); *H01L 21/76825* (2013.01); *H01L 21/76826* (2013.01); *H01L 21/76828* (2013.01); *H01L 21/76834* (2013.01); *H01L 21/02326* (2013.01)

(56) References Cited

U.S. PATENT DOCUMENTS

| | | | |
|---|---|---|---|
| 8,685,867 B1 | 4/2014 | Danek et al. | |
| 9,847,222 B2 | 12/2017 | Reilly et al. | |
| 10,600,688 B2 * | 3/2020 | Zhang | H01L 21/76888 |
| 11,127,675 B2 * | 9/2021 | Hsu | H01L 21/76877 |
| 2007/0166982 A1 | 7/2007 | Preusse et al. | |
| 2010/0311220 A1 | 12/2010 | Matsuo et al. | |
| 2013/0217243 A1 | 8/2013 | Underwood et al. | |
| 2015/0104923 A1 | 4/2015 | Tsai et al. | |
| 2015/0179501 A1 | 6/2015 | Jhaveri et al. | |
| 2016/0013051 A1 | 1/2016 | Zeng et al. | |
| 2016/0079034 A1 | 3/2016 | Yieh et al. | |
| 2016/0194758 A1 | 7/2016 | Nemani et al. | |
| 2018/0096886 A1 | 4/2018 | Reddy et al. | |
| 2019/0164848 A1 | 5/2019 | Chung et al. | |
| 2019/0258153 A1 | 8/2019 | Nemani et al. | |

OTHER PUBLICATIONS

CT International Search Report and Written Opinion for PCT/US2021/027006 dated Jul. 30, 2021.

* cited by examiner

METHOD OF DIELECTRIC MATERIAL FILL AND TREATMENT

CROSS-REFERENCE TO RELATED APPLICATIONS

This application is a continuation of and claims benefit of U.S. patent application Ser. No. 18/108,338 filed on Feb. 10, 2023, issued as U.S. Pat. No. 12,046,508 issued on Jul. 23, 2024, which is a continuation of U.S. patent application Ser. No. 16/848,784, filed Apr. 14, 2020, issued as U.S. Pat. No. 11,615,984 issued on Mar. 28, 2023, the entire contents of each of the aforementioned related patent applications being herein incorporated by reference.

FIELD

Embodiments of the present disclosure generally relate to the field of electronic device manufacturing and modifying a property of a dielectric layer.

BACKGROUND

Dielectric materials are broadly used in the semiconductor industry to produce electronic devices of an ever-decreasing size. Generally, the dielectric materials are used as gap-fill films, shallow trench insulations (STI), via fills, masks, gate dielectrics, or as other electronic device features.

Dielectric materials typically include silicon containing materials such as silicon dioxide ($SiO_2$) and may be formed from precursors into a flowable material using a flowable chemical vapor deposition (FCVD) process. Flowable silicon containing materials processes, e.g., silicon containing material layers deposited using a (FCVD) process, generally provide for improved gap fill performance of high aspect ratio features when compared to silicon containing material layers deposited using conventional methods. However, the inventors have found that low-k dielectric material layers typically provided by an FCVD process problematically include voids leading to lower or poor low-k dielectric film density when forming low-k dielectric layers.

While flowable low-k material may be further treated after deposition thereof, the inventors have found that oxygen treatment and annealing create a risk of damaging underlying metal features such as metal lines formed by subtractive etch methods on the substrate due to oxidation or are otherwise inadequate for treating low-k containing materials disposed in high aspect height to width ratio openings such as the space(s) between the metal lines formed by subtractive methods. For example, high temperature anneals may induce film shrinkage and stress resulting in cracking, peeling of the film, or both, hindering the dielectric film formation in deep trench and via fill applications. Further, oxidation of the metal line lowers device reliability and may for example lower the electric field in a metal oxide semiconductor (MOS) gate oxide at which the MOS gate oxide breaks down, or irreversibly loses insulating properties (Ebd).

Accordingly, what is needed are improved methods of forming a low-k dielectric layer for subtractive interconnect to achieve a desired density and/or other desired material properties of the low-k dielectric layer while eliminating or reducing oxidation of one or more metal features.

SUMMARY

Methods and apparatus for making a semiconductor substrate are provided herein. In some embodiments, a method of making a semiconductor device includes etching a metal layer disposed atop a substrate to form one or more metal lines having a top surface, a first side, and a second side; depositing a passivation layer atop the top surface, the first side, and the second side under conditions sufficient to reduce or eliminate oxygen contact with the one or more metal lines; depositing a flowable layer of low-k dielectric material atop the passivation layer in a thickness sufficient to cover the one or more metal lines; and contacting the flowable layer of low-k dielectric material with oxygen under conditions sufficient to anneal and increase a density of the flowable layer of low-k dielectric material.

In some embodiments, the present disclosure relates to a method of making a semiconductor device including: depositing a flowable layer of low-k dielectric material over one or more passivated features of a substrate; and implanting oxygen throughout the flowable layer of low-k dielectric material to anneal and increase a density of the flowable layer of low-k dielectric material, wherein the one or more passivated features includes a protective layer having a thickness sufficient to prevent oxygen from contacting a metal portion of the one or more passivated features.

In some embodiments, the present disclosure relates to a non-transitory computer readable medium having instructions stored thereon that, when executed, cause a method for making a semiconductor device including: etching a metal layer disposed atop a substrate to form one or more metal lines having a top surface, a first side, and a second side; depositing a passivation layer atop the top surface, the first side, and the second side under conditions sufficient to reduce or eliminate oxygen contact with the one or more metal lines; depositing a flowable layer of low-k dielectric material atop the passivation layer in a thickness sufficient to cover the one or more metal lines; and contacting the flowable layer of low-k dielectric material with oxygen under conditions sufficient to anneal and increase a density of the low-k dielectric material.

In embodiments, the present disclosure relates to an apparatus configured for etching a metal layer disposed atop a substrate to form one or more metal lines having a top surface, a first side, and a second side; depositing a passivation layer atop the top surface, the first side, and the second side under conditions sufficient to reduce or eliminate oxygen contact with the one or more metal lines; depositing a flowable layer of low-k dielectric material atop the passivation layer in a thickness sufficient to cover the one or more metal lines; and contacting the flowable layer of low-k dielectric material with oxygen under conditions sufficient to anneal and increase a density of the flowable layer of low-k dielectric material.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
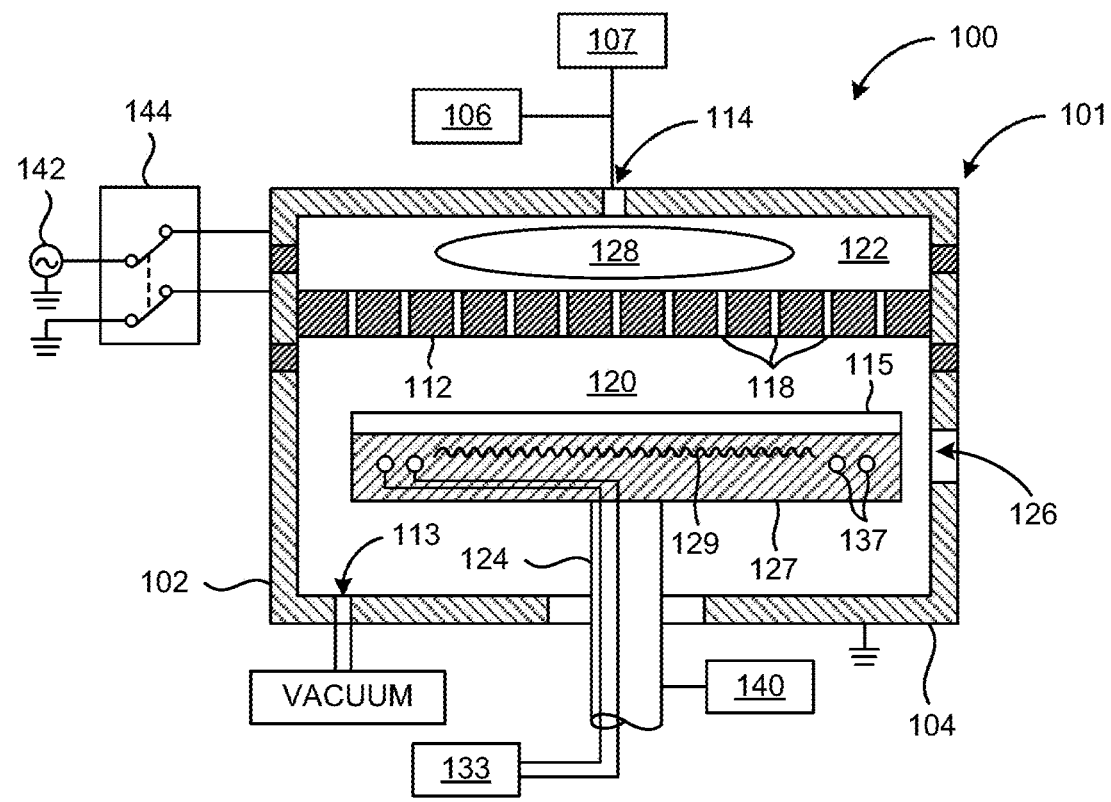
FIG. 1 is a schematic cross-sectional view of a processing chamber for use in methods of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for forming a semiconductor device having one or more passivated metal surfaces including a flowable low-k dielectric material disposed and cured thereon are provided herein. In embodiments, the present disclosure provides a method of making a semiconductor device including: etching a metal layer disposed atop a substrate to form one or more metal lines having a top surface, a first side, and a second side; depositing a passivation layer atop the top surface, the first side, and the second side under conditions sufficient to reduce or eliminate oxygen contact with the one or more metal lines; depositing a flowable layer of low-k dielectric material atop the passivation layer in a thickness sufficient to cover the one or more metal lines; and contacting the flowable layer of low-k dielectric material with oxygen under conditions sufficient to anneal and increase a density of the flowable layer of low-k dielectric material. The inventive methods described herein may advantageously be used to facilitate formation of improved metal contacts, vias, and gates by protecting a metal underlayer to avoid oxidation of the metal underlayer and avoid both high contact resistance and poor gap fill. By passivating a metal feature or surface thereof, the purity of the metal underlayer can be maintained as oxygen or oxygen containing molecules densify and/or anneal a flowable low-k dielectric layer disposed thereon leading to reduced contact resistance and reducing a risk of voids or larger seams while improving device reliability.

FIG. 1 is a schematic cross-sectional view of a processing chamber suitable for use in methods of the present disclosure. In some embodiments, the processing chamber 100 includes a chamber lid assembly 101, one or more sidewalls 102, and a chamber base 104 which collectively define a processing volume 120. The chamber lid assembly 101 includes a chamber lid 103, a showerhead 112, and an electrically insulating ring 105, disposed between the chamber lid 103 and the showerhead 112, which define a plenum 122. A gas inlet 114, disposed through the chamber lid 103 is fluidly coupled to a gas source 106. In some embodiments, the gas inlet 114 is further fluidly coupled to a remote plasma source 107. The showerhead 112, having a plurality of openings 118 disposed therethrough, is used to uniformly distribute processing gases or oxygen from the plenum 122 into the processing volume 120 through the plurality of openings 118.

In some embodiments, a power supply 142, such as an RF or VHF power supply, is electrically coupled to the chamber lid via a switch 144 when the switch is disposed in a first position (as shown). When the switch is disposed in a second position (not shown) the power supply 142 is electrically coupled to the showerhead 112. In some embodiments, the switch 144 is optionally in a first position and the power supply 142 is used to ignite and maintain a first plasma which is remote from the substrate 115, such as the remote plasma 128 disposed in the plenum 122. In some embodiments, the remote plasma 128 is composed of the processing gases flowed into the plenum and maintained as a plasma by the capacitive coupling of the power from the power supply 142 therewith. In some embodiments, the switch 144 is in a second position and the power supply 142 is used to ignite and maintain a second plasma (not shown) in the processing volume 120 between the showerhead 112 and the substrate 115 disposed on the substrate support 127.

In some embodiments, the processing volume 120 is fluidly coupled to a vacuum source, such as to one or more dedicated vacuum pumps, through a vacuum outlet 113 which maintains the processing volume 120 at sub-atmospheric conditions and evacuates the processing and other gases therefrom. A substrate support 127, disposed in the processing volume 120, is disposed on a support shaft 124 sealingly extending through the chamber base 104, such as being surrounded by bellows (not shown) in the region below the chamber base 104. The support shaft 124 is coupled to a controller 140 that controls a motor to raise and lower the support shaft 124, and the substrate support 127 disposed thereon, to support a substrate 115 during processing thereof, and to transfer of the substrate 115 to and from the processing chamber 100.

In embodiments, the substrate 115 is loaded into the processing volume 120 through an opening 126 in one of the one or more sidewalls 102, which is conventionally sealed with a door or a valve (not shown) during substrate 115 processing. In embodiments, the substrate 115 is transferred to and from the surface of the substrate support 127 using a conventional lift pin system (not shown) comprising a plurality of lift pins (not shown) movably disposed through the substrate support. Typically, the plurality of lift pins are contacted from below by a lift pin hoop (not shown) and moved to extend above the surface of the substrate support 127 lifting the substrate 115 therefrom and enabling access by a robot handler. When the lift pin hoop (not shown) is in a lowered position the tops of the plurality of lift pins are located to be flush with, or below, the surface of the substrate support 127 and the substrate rests thereon. The substrate support is moveable between a lower position, below the opening 126, for placement of a substrate thereon or removal of a substrate 115 therefrom, and a raised position for processing of the substrate 115. In some embodiments, the substrate support 127, and the substrate 115 disposed thereon, are maintained at a desired processing temperature using a resistive heating element 129 and/or one or more cooling channels 137 disposed in the substrate support. Typically, the cooling channels 137 are fluidly coupled to a coolant source 133 such as a modified water source having relatively high electrical resistance or a refrigerant source. In some embodiments, the substrate is disposed within the processing chamber 100 configured to deposit a flowable layer of low-k dielectric material atop a passivation layer in a thickness sufficient to cover the one or more metal lines; and contacting the flowable layer of low-k dielectric material with oxygen under conditions sufficient to anneal and increase a density of the flowable layer of low-k dielectric material as described further below.

In some embodiments, the processing chamber 100 is further coupled to a remote plasma source 107 which provides gaseous treatment radicals to the processing volume 120. Typically, the remote plasma source (RPS) includes an inductively coupled plasma (ICP) source, a capacitively coupled plasma (CCP) source, or a microwave plasma source. In some embodiments, the remote plasma source is a standalone RPS unit. In other embodiments, the remote plasma source is a second processing chamber in fluid communication with the processing chamber 100. In other embodiments, the remote plasma source is the remote plasma 128 ignited and maintained in the plenum 122 between the chamber lid 103 and the showerhead 112.

Figure 2A:
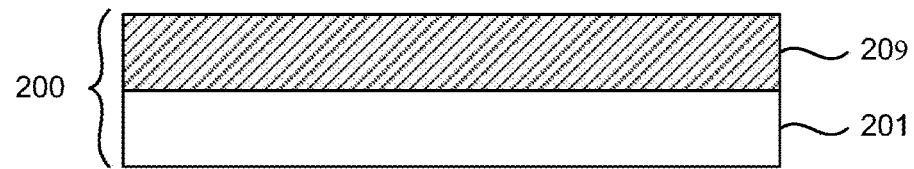
FIG. 2A is a side view of a semiconductor substrate for treatment in accordance with the present disclosure.

FIG. 2A is a side view of an electronic device structure 200 in accordance with the present disclosure. In embodiments, electronic device structure 200 includes a substrate 201. In some embodiments, substrate 201 includes a semiconductor material, e.g., silicon (Si), germanium (Ge), silicon germanium (SiGe), a III-V material based material, or any combination thereof. In some embodiments, the substrate is suitable for an integrated device. In embodiments, substrate 201 may be formed of or include one or more of silicon (Si), silicon oxide, such as silicon monoxide (SiO) or silicon dioxide ($SiO_2$), silicon nitride (such as SiN), or the like. In non-limiting embodiments, the substrate 201 may be formed of a dielectric material, layer thereof, or made of the same materials as described above such as SiN, SiO, and the like. In embodiments, a low-k dielectric material may be suitable as a substrate 201 or layer thereof (e.g., a material having a dielectric constant less than silicon oxide, or less than about 3.9), or the like. In addition, the substrate 201 may include additional layers of materials or may have one or more completed or partially completed structures or devices formed in, on or under the substrate 201 (not shown). In some embodiments, the substrate 201 may include any number of features (such as a plurality of trenches, vias, self-aligning vias, self-aligned contact features, duel damascene structures, and the like) or may be suitable for use in a number of process applications such as dual-damascene fabrication processes, self-aligned contact feature processing, and the like.

In embodiments, substrate 201 may not be limited to any size or shape. The substrate 201 may be a round wafer having a 200 mm diameter, a 300 mm diameter or other diameters, such as 450 mm, among others. The substrate 201 can also be any polygonal, square, rectangular, curved or otherwise non-circular workpiece, such as a polygonal glass substrate used in the fabrication of flat panel displays.

Figure 2B:
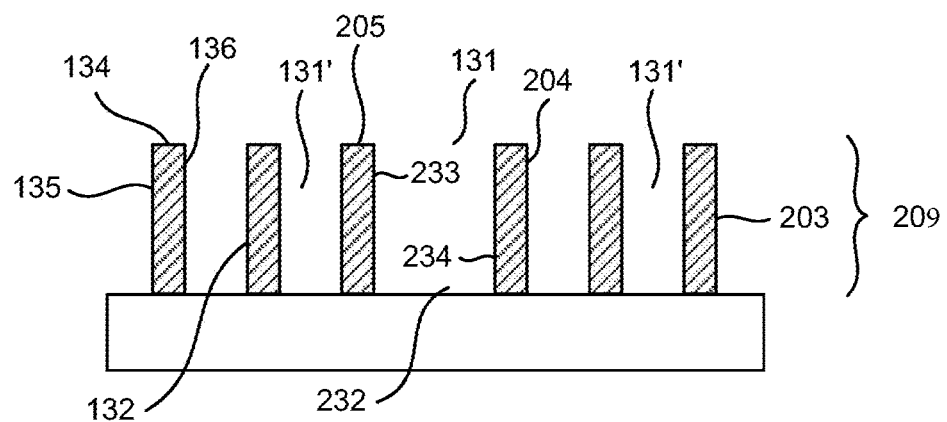
FIG. 2B is a side view of a semiconductor substrate for treatment in accordance with the present disclosure.
Figure 2C:
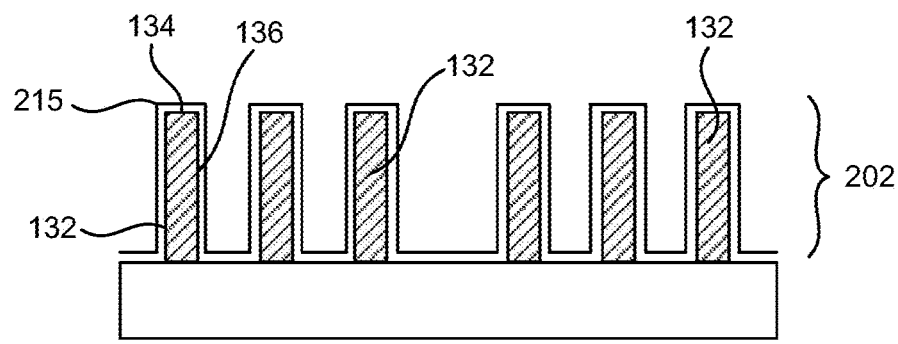
FIG. 2C is a side view of a passivation layer deposited over the features of the semiconductor substrate according to embodiments of the present disclosure.
Figure 2D:
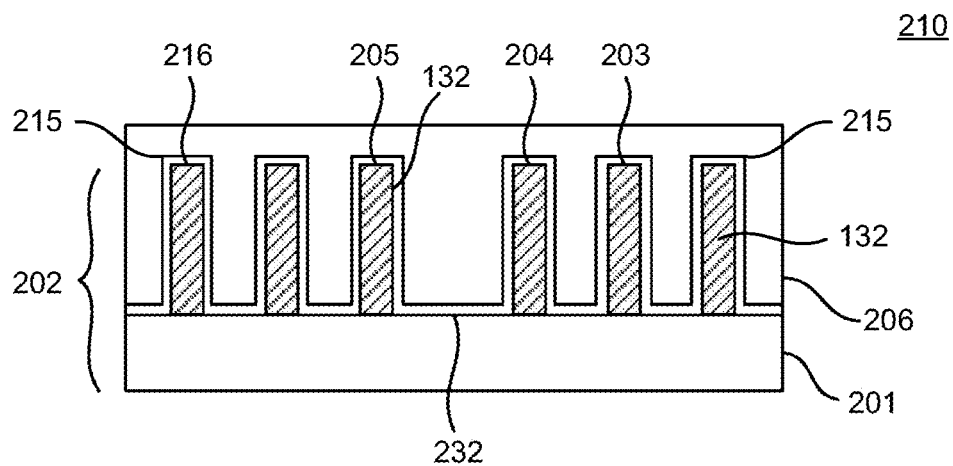
FIG. 2D is a side view of a flowable layer deposited over the features of the semiconductor substrate according to embodiments of the present disclosure.
Figure 2E:
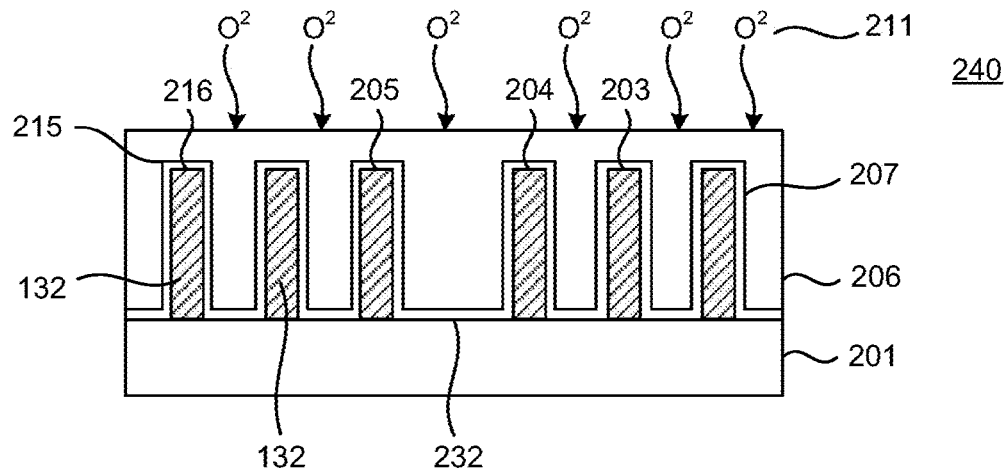
FIG. 2E shows oxygen contacting the flowable layer according to embodiments of the present disclosure.
Figure 2F:
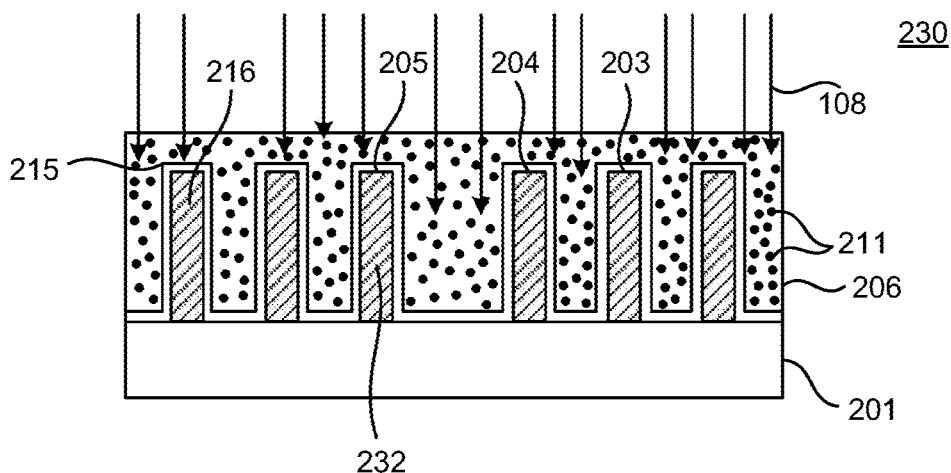
FIG. 2F shows implanting or incorporating oxygen into the flowable layer according to embodiments of the present disclosure.
Figure 3:
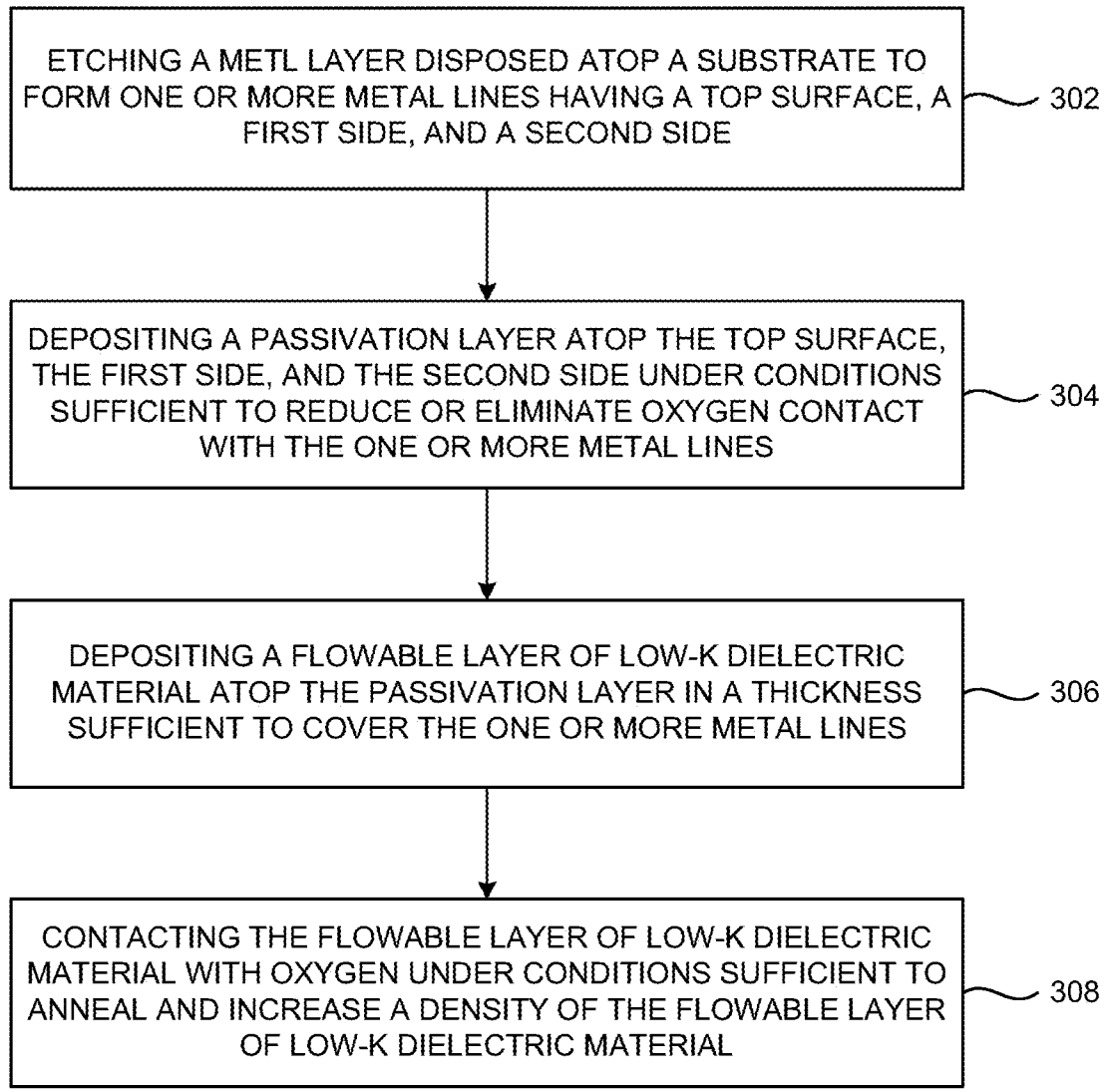
FIG. 3 is a flow diagram of making a semiconductor device in accordance with some embodiments of the present disclosure.
Figure 6:
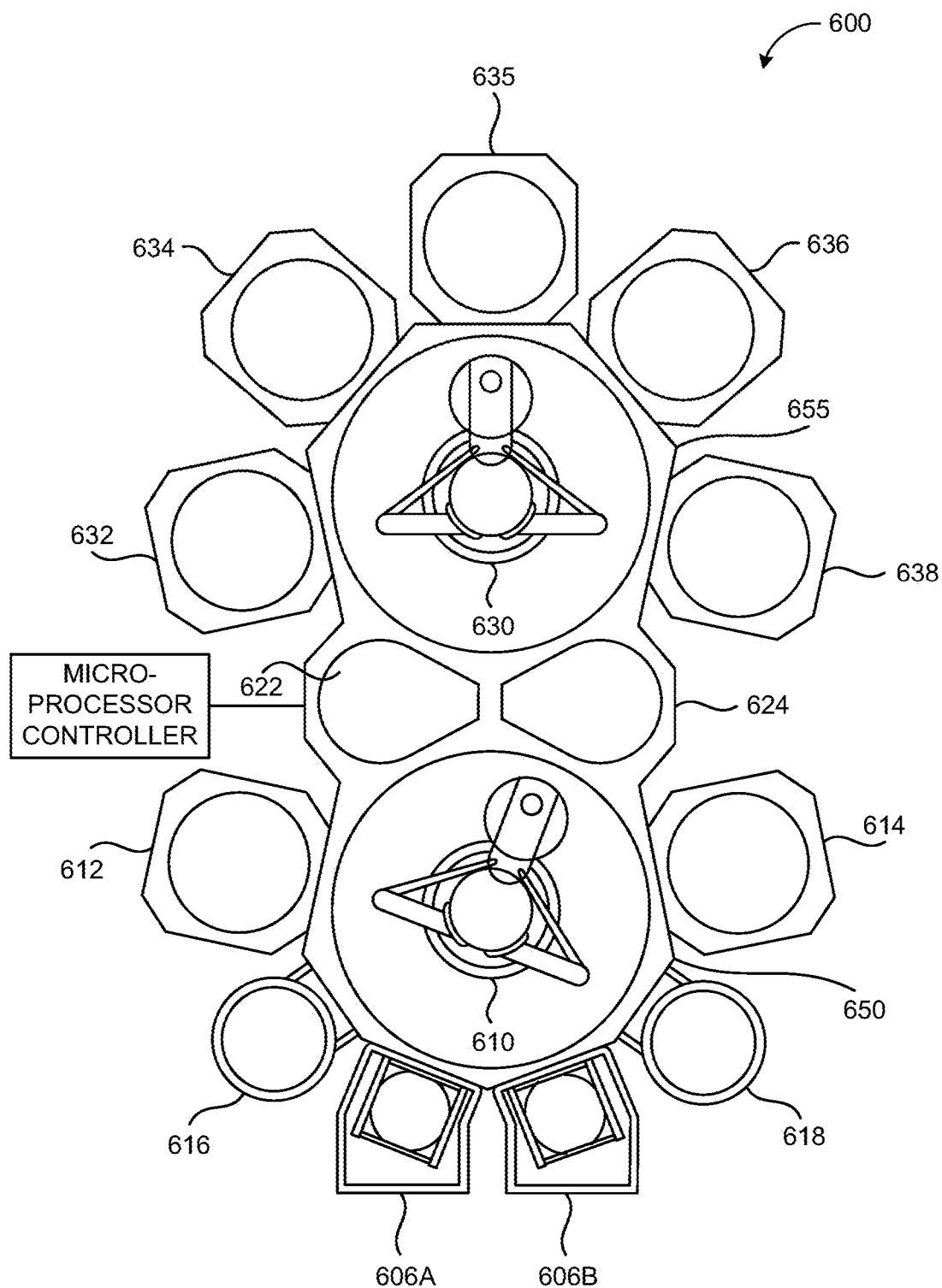
FIG. 6 depicts a cluster tool suitable to perform methods for processing a substrate in accordance with some embodiments of the present disclosure.

In some embodiments, the method 300 described below in FIG. 3 is described below with respect to the stages of processing a substrate as depicted in FIGS. 2A-2F. The methods described herein may be performed in individual process chambers such as processing chamber 100 or etching chambers that may be provided in a standalone configuration or as part of one or more cluster tools, for example, an integrated tool 600 (i.e., cluster tool) as shown in FIG. 6 or such as those available from Applied Materials, Inc. of Santa Clara, CA. Other processing chambers, including those available from other manufacturers, may also be adapted to benefit from the present disclosure.

Referring to FIG. 2A, in embodiments, substrate 201 includes a metal layer 209 such as a blanket metal layer disposed thereon. In embodiments, metal layer 209 is deposited to a thickness sufficient to be patterned or etched to form metallization interconnect layers for integrated circuits. In one embodiment, metal layer 209 includes one or more of copper (Cu), aluminum (Al), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), gold (Au), platinum (Pt), or combinations thereof. In some embodiments, the metal layer 209 includes one or more of ruthenium (Ru), molybdenum (Mo), copper (Cu), tungsten (W), aluminum (Al), or combinations thereof. In some embodiments, metal layer 209 includes one or more metal layers deposited on substrate 201 using one or more deposition techniques, such as but not limited to a chemical vapor deposition (CVD), e.g., a plasma enhanced chemical vapor deposition (PECVD), a physical vapor deposition (PVD), molecular beam epitaxy (MBE), metalorganic chemical vapor deposition (MOCVD), atomic layer deposition (ALD), or other deposition techniques known to one of ordinary skill in the art of electronic device manufacturing.

Referring now to FIG. 2B and FIG. 3, in some embodiments, metal layer 209 is etched to form a plurality of features, such as features 203, 204 and 205. For example, referring to method 300 of making a semiconductor device, method 300 includes at process sequence 302 etching a metal layer 209 disposed atop a substrate 201 to form one or more metal lines 132 having a top surface 134, a first side 135, and a second side 136. As shown in FIG. 2B, a plurality of trenches, such as a trench 131 and 131' are formed on substrate 201 between the features such as one or more metal lines 132. In embodiments, the trench has a bottom portion 232 and opposing sidewalls 233 and 234. Bottom portion 232 is an exposed portion of the substrate 201 between the features 204 and 205. A sidewall 233 is the sidewall of the feature 205, and a sidewall 234 is the sidewall of the feature 204. In some embodiments, one or more layers of the metal layer 209 are patterned and etched using patterning and etching techniques known to one of ordinary skill in the art of electronic device manufacturing to form features, such as features 203, 204 and 205. In an embodiment, each of the features of the metal layer 209 is a stack of one or more layers. In an embodiment, the features of the metal layer 209 are features of electronic devices, e.g., transistors, memories, capacitors, resistors, optoelectronic devices, switches, and any other active and passive electronic devices. In some embodiments, the metal layer 209 is etched to form one or more semiconductor fins formed on the substrate 201. In some embodiments, the features, e.g., 203, 204 and 205 are fin structures to form, for example, a tri-gate transistor array including multiple transistors, such as a tri-gate transistor (transistor 500) shown in FIG. 5.

In some embodiments, the height of the features 203, 204 and 205 is in an approximate range from about 30 nm to about 500 nm (nanometer). In some embodiments, the distance between the features 203 and 204 is from about 2 nm to about 100 nm. In some embodiments, the space between metal features e.g., 203, 204 and 205 are characterized as having a high-aspect ratio (height to width) such as 2:1 or 20:1.

In some embodiments, the features 203, 204 and 205 include a conductive layer or are made of a conductive material. In an embodiment, the features of the device layer 202 include a metal such as those described above, for example, copper (Cu), aluminum (Al), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), gold (Au), platinum (Pt), or other conductive layer known to one of ordinary skill in the art of electronic device manufacturing, or any combination thereof.

As shown in FIG. 2C, a passivation layer 215 is deposited over the features such as features 203, 204 and 205 of the device layer 202. For example, referring to process sequence 304 in FIG. 3, the method includes depositing a passivation layer atop the top surface 134, the first side 135, and the second side 136 under conditions sufficient to reduce or eliminate oxygen contact with the one or more metal lines 132. In some embodiments, process sequence 304 is performed in a processing system without breaking vacuum. In some embodiments, the passivation layer 215 covers top surface 134 of each of the features of the device layer 202, as shown in FIG. 2C. In some embodiments, the passivation layer 215 is deposited to protect the features of the device layer 202 from oxygen contact at later stage. In some embodiments, the passivation layer 215 is a hard mask layer. In some embodiments, the passivation layer covers the top surface 134 and sidewalls, such as a first side 135 and a second side 136 of each of the features of the device layer 202. In some embodiments, the passivation layer 215 is a nitride layer, e.g., silicon nitride, titanium nitride, or carbon based film such as SiC, other protection layer, or any combination thereof. In some embodiments, the passivation layer 215 includes silicon nitride, silicon carbon nitride (SiCN), or SiBCN. In some embodiments, the passivation layer 215 may include a combination of an etch stop material, e.g., aluminum nitride (AlN), and silicon nitride, silicon carbon nitride (SiCN), or SIBCN. In some embodiments, the passivation layer 215 may include a selective metal cap, e.g., cobalt (Co), with silicon nitride, silicon carbon nitride (SiCN), or SIBCN. In some embodiments, the passivation layer is made entirely of material that is devoid of oxygen.

In some embodiment, the thickness of the passivation layer 215 is from about 1 nm to about 50 nm such as 1-25 nm or 1-5 nm. In some embodiments, the thickness of the passivation layer 215 is sufficient to prevent oxygen from contacting the top surface 134 and sidewalls, such as a first side 135 and a second side 136 of each of the features of the device layer 202.

In some embodiments, the passivation layer 215 can be deposited using one or more deposition techniques, such as but not limited to a chemical vapor deposition (CVD), e.g., a Plasma Enhanced Chemical Vapor Deposition (PECV"), a physical vapor deposition (PVD), molecular beam epitaxy (MBE), metalorganic chemical vapor deposition (MOCVD), atomic layer deposition (ALD), or other deposition techniques known to one of ordinary skill in the art of electronic device manufacturing.

FIG. 2D shows a side view of an electronic device structure 210 in accordance with the present disclosure. In embodiments, electronic device structure 210 includes a substrate 201 after a flowable layer 206 is deposited over, such as atop, and around the features of the device layer 202. In some embodiments, as shown in FIG. 3 and process sequence 306, methods of the present disclosure include depositing a flowable layer 206 of low-k dielectric material atop the passivation layer 215 in a thickness sufficient to cover the one or more metal lines 132. In embodiments, methods of the present disclosure include depositing a flowable layer of oxide material atop the passivation layer 215 in a thickness sufficient to cover the one or more metal lines 132. In some embodiments, flowable layer 206 covers passivation layer 215 deposited on top portions, sidewalls of the features of the device layer and bottom portions of the trenches, such as bottom portion 232. In some embodiments, flowable layer 206 is deposited on portions of the substrate 201 filling in the space between the features of the device layer 202. In an embodiment, flowable layer 206 is a low-k dielectric layer. Non-limiting examples of low-k dielectric material suitable for use herein may include carbon doped oxides or variants thereof, e.g., fluorinated carbon, nano-clustering silica (NCS), mesoporous oxides, or organic "spin-on" materials, BLACK DIAMOND® brand film layers, e.g., BD1, BDII and BD3, available from Applied Materials Inc., Santa Clara, CA. In embodiments, other suitable low-k dielectric materials, e.g., materials having a dielectric constant of between about 2.4 and 2.5 may also be utilized in accordance with the embodiment described herein. In some embodiments, flowable layer 206 is an oxide layer, e.g., silicon oxide (e.g., $SiO_2$), aluminum oxide ($Al_2O_3$), or other oxide layer, a nitride layer, e.g., silicon nitride (e.g., $Si_3N_4$), or other nitride layer, a carbide layer (e.g., carbon, SiOC), or other carbide layer, an oxide nitride layer, (e.g., SiON), or any combination thereof. In embodiments, only aluminum oxide ($Al_2O_3$) is included in the low-k dielectric material. In embodiments, process sequence 306 is performed in the processing system without breaking vacuum.

In some embodiments, the as deposited density of the flowable layer 206 is e.g., less than or about 1.5 $g/cm^3$. In some embodiments, the density of the flowable layer 206 is increased by the methods of the present disclosure such as to an amount greater than 1.5 $g/cm^3$. Generally, the density of a material refers to the mass of the material per unit volume (mass divided by volume). In some embodiments, flowable layer 206 has pores (not shown). In some embodiments, pores in the material refer to regions which contain something other than the considered material (e.g., air, vacuum, liquid, solid, or a gas or gaseous mixture) so that the density of the flowable layer varies depending on location.

In some embodiments, flowable layer 206 is a flowable CVD film developed as a flowable layer of silicon containing material, wherein as-deposited film typically contains Si—H, Si—N, and —NH bonds. The film is then converted in an oxidizing environment to Si—O network through curing and annealing in accordance with the present disclosure. In some embodiments, flowable layer 206 is deposited using one or more flowable chemical vapor deposition (FCVD) deposition techniques developed by Applied Materials, Inc. located in Santa Clara, CA, or other FCVD deposition techniques known to one of ordinary skill in the art of electronic device manufacturing. In some embodiments, the thickness of the flowable layer 206 is from about 30 nm to about 500 nm. In some embodiments, the thickness of the flowable layer 206 is from about 40 nm to about 100 nm.

In some embodiments, the flowable layer 206 acts as a gap fill layer. In some embodiments, flowable layer 206 acts as a gap fill layer over one portion of substrate and acts as hard mask layer over other portion of substrate. In some embodiments, flowable layer 206 acts as a gap fill layer in a high-aspect ratio (height to width) feature such as 2:1 or 20:1, wherein the feature has a width less than 20 nanometer.

Referring now to FIG. 2E, oxygen containing materials such as oxygen molecules 211, ozone, or combinations thereof contact flowable layer 206 according to some embodiments of the present disclosure. Referring to FIG. 3, method 300 includes at process sequence 308 contacting the flowable layer 206 of low-k dielectric material with oxygen under conditions sufficient to anneal and increase a density of the flowable layer of low-k dielectric material. In some embodiments, a flowable layer of silicon containing material disposed on a substrate is contacted with a plurality of oxygen, ozone, or combinations thereof under conditions sufficient to anneal and/or increase a density of the flowable layer of silicon containing material. For example, the density of the material may be increased 5 to 100 times after contact with oxygen under conditions sufficient to anneal the flowable layer of low-k dielectric material. In some embodiments, the flowable layer of low-k dielectric material includes an oxide layer, a nitride layer, a carbide layer, an oxynitride layer, or combinations thereof. In some embodiments, the flowable layer of low-k dielectric material includes silicon oxide ($SiO_2$), silicon oxide nitride (SiON), silicon nitride ($Si_3N_4$), silicon oxide carbide (SiOC), or combinations thereof. In some embodiments, contacting the flowable layer of low-k dielectric material with oxygen is at a pressure of 760 Torr to 40,000 Torr. In some embodiments, contacting the flowable layer of low-k dielectric material with oxygen is at a temperature of 100° C. to 400° C. In some embodiments, contacting the flowable layer of low-k dielectric material with oxygen is for a duration of up to 10 minutes. In some embodiments, the oxygen penetrates through a top portion and bottom portion of the flowable layer of low-k dielectric material. In some embodiments, the metal layer comprises one or more of ruthenium, molybdenum, copper, tungsten, or aluminum. In some embodiments, the oxygen is disposed within a reaction gas, wherein the reaction gas includes one or more of hydrogen, nitrogen, or combinations thereof. In some embodiments, the passivation layer includes silicon nitride ($Si_3N_4$), silicon carbide (SiC), silicon carboxy nitride (SiCN) or combinations thereof. In some embodiments, the semiconductor device is characterized by Ebd greater than 5 MV/cm at capacitance (integrated-k value) of 3.0-3.2. In some embodiments, the method of making a semiconductor device further includes curing the flowable layer of low-k dielectric material with ultraviolet light.

In some embodiments, the plurality of oxygen molecules are disposed within a reaction gas, wherein the reaction gas comprises one or more of oxygen ($O_2$), hydrogen ($H_2$) or nitrogen ($N_2$). For example, the reaction gas may include a mixture of hydrogen mixed with oxygen or hydrogen mixed with nitrogen, wherein the mixture includes oxygen, ozone, or combinations thereof. In embodiments, the reaction gas comprising oxygen molecules and may further comprise up to 95% hydrogen.

Referring to FIG. 2F and device 230, implanting a plurality of oxygen molecules such as oxygen molecules 211 into the flowable layer 206 according to embodiments of the present disclosure is shown. A plurality of oxygen molecules such as oxygen molecules 211 are supplied to the flowable layer 206, as shown in FIG. 2F. In some embodiments, a plurality of oxygen molecules exclude oxygen radicals. In embodiments, a plurality of oxygen molecules penetrate or are incorporated into a 1/3 portion top portion, top half, or top 2/3 portion of the flowable layer 206. In some embodiments, as a plurality of oxygen molecules are supplied under conditions sufficient to penetrate throughout all of the flowable layer 206. In some embodiments, a plurality of oxygen molecules are supplied under conditions sufficient to implant and be incorporated throughout all of the flowable layer 206. In embodiments, the passivation layer 215 prevents the oxygen molecules such as oxygen molecules 211 within the flowable layer 206 from contacting and/or reacting with the metal lines such as features 203, 204 and 205 of the device layer 202.

In some embodiments, as a plurality of oxygen molecules are supplied in an amount sufficient to increase the density of the flowable layer 206. In some embodiments, oxygen molecules 211 are supplied in an amount sufficient and under conditions suitable to increase the density of the flowable layer 206. In some embodiments, the density is measurable by known techniques in the art including proxies such as wet etch rate ratio (WERR) indicative of changes in density. In some embodiments, in accordance with the present disclosure a treated flowable layer of low-k dielectric material is formed and has a wet etch rate ratio (WERR) in dilute HF of between about 9-10 after an etch duration of 0-2 minutes. In embodiments, the wet etch rate ratio is measured relative to a thermal silicon oxide film using dilute HF (e.g., 1:100 HF).

Figure 4:
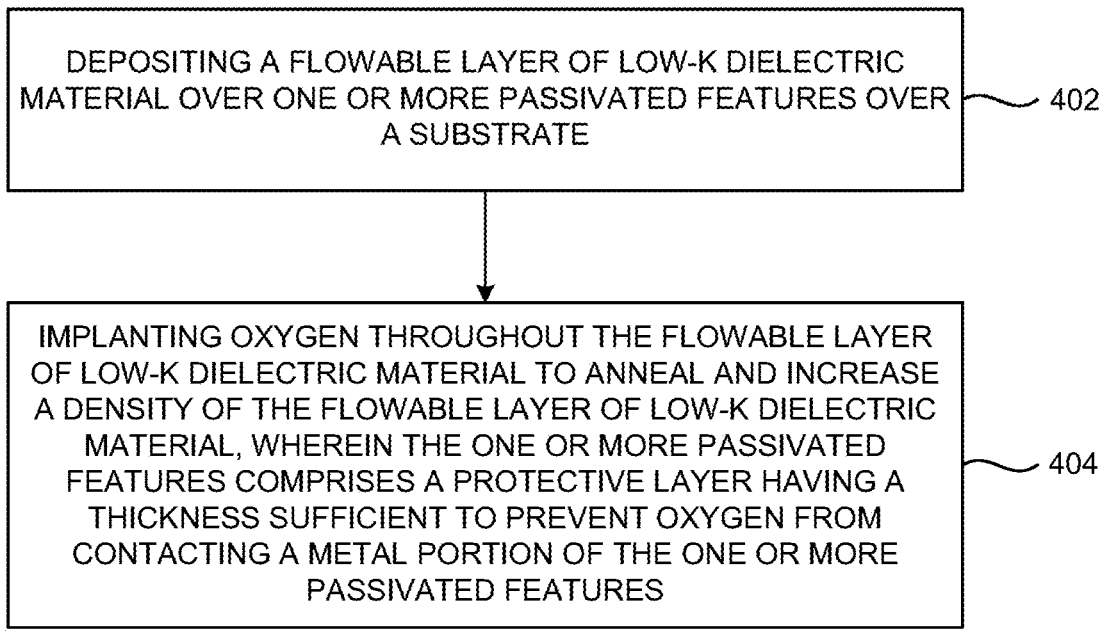
FIG. 4 is a flow diagram an embodiment of making a semiconductor device in accordance with some embodiments of the present disclosure.

Referring now to FIG. 4, a flow diagram of a method of making a semiconductor device in accordance with some embodiments of the present disclosure is shown. In embodiments, the method 400 includes at process sequence 402 depositing a flowable layer of low-k dielectric material over one or more passivated features of a substrate; and at process sequence 404 implanting oxygen throughout the flowable layer of low-k dielectric material to anneal and increase a density of the flowable layer of low-k dielectric material, wherein the one or more passivated features includes a protective layer having a thickness sufficient to prevent oxygen from contacting a metal portion of the one or more passivated features. In some embodiments, the protective layer includes silicon nitride ($Si_3N_4$), silicon carbide (SiC), silicon carboxy nitride (SiCN) or combinations thereof. In some embodiments, the protective layer is the same as the passivation layer described above. In some embodiments, the semiconductor device is characterized by Ebd greater than 5 MV/cm at capacitance (integrated-k value) of 3.0-3.2. In some embodiments, the protective layer has a thickness of about 1-2 nanometers. In some embodiments, contacting the flowable layer of low-k dielectric material with ultraviolet light. In some embodiments, the protective layer is devoid of oxygen.

Figure 5:
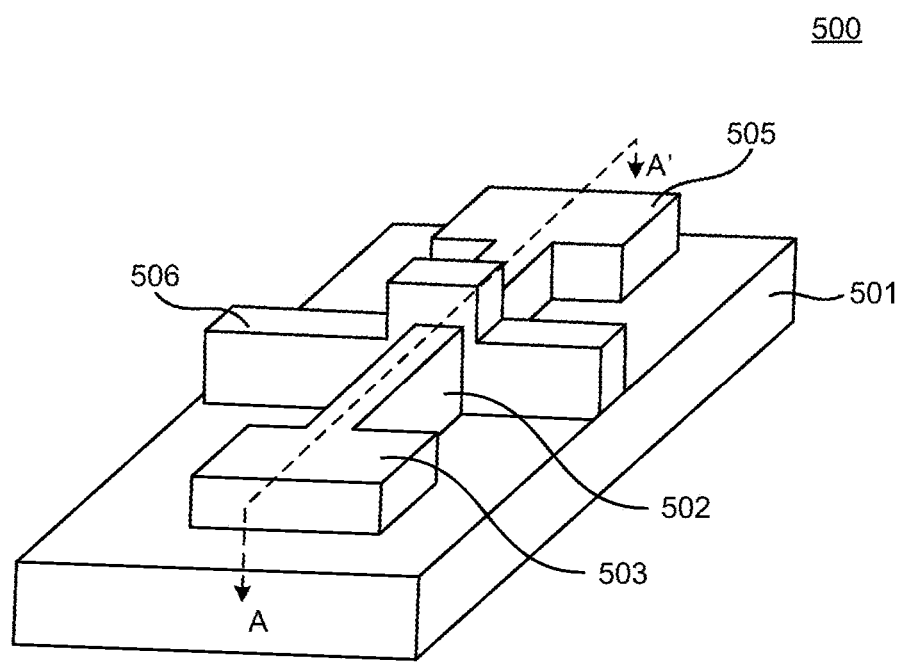
FIG. 5 is a perspective view of a tri-gate transistor structure according to one embodiment of the present disclosure.

Referring now to FIG. 5, a perspective view of a tri-gate transistor (transistor 500) according to embodiments of the present disclosure is shown. In some embodiments a fin layer including a fin 502 is formed on a substrate 501. In some embodiments, fin layer represents a cross-sectional view of the fin 502 along A-A1 axis. In an embodiment, tri-gate transistor (transistor 500) is a part of a tri-gate transistor array that includes multiple tri-gate transistors. In some embodiments, a flowable dielectric layer modified by implanting oxygen in accordance with the present disclosure as described above with respect to FIGS. 2A-2F is formed on substrate 501 adjacent to fin 502 to provide field isolation (e.g., STI) regions that isolate one electronic device from other devices on substrate 501. In some embodiments, the fin 502 protrudes from a top face of the substrate 501. Fin 502 can be formed of any well-known semiconductor material. In some embodiments, a gate dielectric layer (not shown) is deposited on and three sides of the fin 502. In some embodiments, the gate dielectric layer is formed on the opposing sidewalls and on the top surface of the fin 502. As shown in FIG. 5, a gate electrode 506 is deposited on the gate dielectric layer on the fin 502. Gate electrode 506 is fanned on and around the gate dielectric layer on the fin 502 as shown in FIG. 5. In some embodiments, a drain region 505 and a source region 503 are formed at opposite sides of the gate electrode 506 in fin 502, as shown in FIG. 5.

Referring now to FIG. 6, the methods described herein may be performed in individual process chambers that may be provided in a standalone configuration or as part of one or more cluster tools, for example, an integrated tool 600 (i.e., cluster tool) described below with respect to FIG. 6. In embodiments, a cluster tool is configured for performing the methods such as method 300 for processing a substrate as described herein including: etching a metal layer disposed atop a substrate to form one or more metal lines having a top surface, a first side, and a second side; depositing a passivation layer atop the top surface, the first side, and the second side under conditions sufficient to reduce or eliminate oxygen contact with the one or more metal lines; depositing a flowable layer of low-k dielectric material atop the passivation layer in a thickness sufficient to cover the one or more metal lines; and contacting the flowable layer of low-k dielectric material with oxygen under conditions sufficient to anneal and increase a density of the flowable layer of low-k dielectric material. In embodiments, a cluster tool is configured for performing the methods such as method 400 for processing a substrate as described herein including: depositing a flowable layer of low-k dielectric material over one or more passivated features over a substrate; and implanting oxygen throughout the flowable layer of low-k dielectric material to anneal and increase a density of the flowable layer of low-k dielectric material, wherein the one or more passivated features comprises a protective layer having a thickness sufficient to prevent oxygen from contacting a metal portion of the one or more passivated features. In embodiments, the cluster tool is configured to operate under vacuum to prevent the formed metal features from contacting oxygen during the manufacturing process sequences. For example, after etching a blanket metal layer to form metal lines, the cluster tool is configured to operate under vacuum to prevent the metal lines from contacting oxygen. In embodiments, the cluster tool may be configured to include additional chambers. Non-limiting examples of an additional chamber for selective metal deposition includes the VOLTA® brand processing chamber available from Applied Materials, Inc., of Santa Clara, CA. Examples of the integrated tool 600 include the CENTURA® and ENDURA® integrated tools, available from Applied Materials, Inc., of Santa Clara, CA. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks while processing.

In embodiments, the integrated tool 600 can include two load lock chambers 606A, 606B for transferring of substrates into and out of the integrated tool 600. Typically, since the integrated tool 600 is under vacuum, the load lock chambers 606A, 606B may "pump down" the substrates introduced into the integrated tool 600. A first robot 410 may transfer the substrates between the load lock chambers 606A, 606B, and a first set of one or more substrate processing chambers 612, 614, 616, 618 (four are shown) coupled to a first central transfer chamber 450. Each substrate processing chamber 612, 614, 616, 618, can be outfitted to perform a number of substrate processing operations. In some embodiments, the first set of one or more substrate processing chambers 612, 614, 616, 618 may include any combination of PVD, ALD, CVD, etch, or degas chambers. For example, in some embodiments, the substrate processing chambers 612, and 614 include a process chamber such as shown in FIG. 1, configured to expose a substrate including a low-k dielectric surface and features such as metal lines to a process gas including an oxidizing agent such as oxygen in accordance with the present disclosure.

In some embodiments, the first robot 610 can also transfer substrates to/from two intermediate transfer chambers 622, 624. The intermediate transfer chambers 622, 624 can be used to maintain ultrahigh vacuum conditions while allowing substrates to be transferred within the integrated tool 600. A second robot 430 can transfer the substrates between the intermediate transfer chambers 622, 424 and a second set of one or more substrate processing chambers 632, 634, 635, 636, 638 coupled to a second central transfer chamber 655. The substrate processing chambers 632, 634, 635, 636, 638 can be outfitted to perform a variety of substrate processing operations including the methods 300, 400 described above in addition to, physical vapor deposition processes (PVD), chemical vapor deposition (CVD), selective metal deposition, etching, orientation and other substrate processes. Any of the substrate processing chambers 612, 614, 616, 618, 632, 634, 635, 636, 638 may be removed from the integrated tool 600 if not necessary for a particular process to be performed by the integrated tool 600.

In some embodiments, the present disclosure relates to a non-transitory computer readable medium having instructions stored thereon that, when executed, cause a reaction chamber to perform a method of making a semiconductor device, including: etching a metal layer disposed atop a substrate to form one or more metal lines having a top surface, a first side, and a second side; depositing a passivation layer atop the top surface, the first side, and the second side under conditions sufficient to reduce or eliminate oxygen contact with the one or more metal lines; depositing a flowable layer of low-k dielectric material atop the passivation layer in a thickness sufficient to cover the one or more metal lines; and contacting the flowable layer of low-k dielectric material with oxygen under conditions sufficient to anneal and increase a density of the flowable layer of low-k dielectric material.

In some embodiments, the present disclosure relates to a non-transitory computer readable medium having instructions stored thereon that, when executed, cause a reaction chamber to perform a method of making a semiconductor device, including: depositing a flowable layer of low-k dielectric material over one or more passivated features over a substrate; and implanting oxygen throughout the flowable layer of low-k dielectric material to anneal and increase a density of the flowable layer of low-k dielectric material, wherein the one or more passivated features comprises a protective layer having a thickness sufficient to prevent oxygen from contacting a metal portion of the one or more passivated features.

In some embodiments the present disclosure relates to a method of making a semiconductor device including: etching a metal layer disposed atop a substrate to form one or more metal lines having a top surface, a first side, and a second side; depositing a passivation layer atop the top surface, the first side, and the second side under conditions sufficient to reduce or eliminate oxygen contact with the one or more metal lines; depositing a flowable layer of oxide material atop the passivation layer in a thickness sufficient to cover the one or more metal lines; and contacting the flowable layer of oxide material with oxygen under conditions sufficient to anneal and increase a density of the flowable layer of low-k dielectric material. In embodiments, the flowable layer of oxide material includes an oxide layer. In embodiments, the material of the oxide layer comprises silicon oxide ($SiO_2$), silicon oxide nitride (SiON), silicon oxide carbide (SiOC), or combinations thereof. In some embodiments, contacting the flowable layer of oxide material with oxygen is at a pressure of 760 Torr to 40,000 Torr.

While the foregoing is directed to embodiments of the present disclosure, other and further embodiments of the disclosure may be devised without departing from the basic scope thereof.

The invention claimed is:

1. A method of making a semiconductor device, comprising:
    etching a metal layer disposed atop a substrate to form one or more metal lines having a top surface, a first side, and a second side;
    depositing a passivation layer atop the top surface, the first side, and the second side to prevent oxygen contact with the one or more metal lines, wherein the passivation layer comprises an etch stop material comprising AlN;
    depositing a flowable layer of low-k dielectric material atop the passivation layer in a thickness sufficient to cover the one or more metal lines;
    contacting the flowable layer of low-k dielectric material with oxygen, ozone, or a combination thereof under conditions sufficient to anneal and increase a density of the flowable layer of low-k dielectric material; and
    wherein the method is conducted without a vacuum break.

2. The method of claim 1, wherein the passivation layer further comprises silicon nitride, silicon carbon nitride, or SIBCN.

3. The method of claim 1, wherein the passivation layer comprises a metal cap.

4. The method of claim 3, wherein the metal cap comprises Co.

5. The method of claim 1, wherein the passivation layer has a thickness from about 1 nm to about 50 nm.

6. The method of claim 1, wherein the passivation layer is deposited via chemical vapor deposition, plasma enhanced chemical vapor deposition, physical vapor deposition, molecular beam epitaxy, metalorganic chemical vapor deposition, atomic layer deposition, or a combination thereof.

7. The method of claim 1, wherein the flowable layer of low-k dielectric material comprises an oxide layer, a nitride layer, a carbide layer, an oxynitride layer, or combinations thereof.

8. The method of claim 1, wherein the flowable layer of low-k dielectric material comprises silicon oxide ($SiO_2$), silicon oxide nitride (SiON), silicon nitride ($Si_3N_4$), silicon oxide carbide (SiOC), or combinations thereof.

9. The method of claim 1, wherein contacting the flowable layer of low-k dielectric material with oxygen, ozone, or a combination thereof is at a pressure of 760 Torr to 40,000 Torr.

10. The method of claim 1, wherein contacting the flowable layer of low-k dielectric material with oxygen, ozone, or a combination thereof is at a temperature of 100 degrees Celsius to 400 degrees Celsius.

11. The method of claim 1, wherein contacting the flowable layer of low-k dielectric material with oxygen, ozone, or a combination thereof is for a duration of up to 10 minutes.

12. The method of claim 1, wherein the oxygen, ozone, or the combination thereof penetrates through a top portion and bottom portion of the flowable layer of low-k dielectric material.

13. The method of claim 1, wherein the metal layer comprises one or more of ruthenium, molybdenum, copper, tungsten, or aluminum.

14. The method of claim 1, wherein the oxygen, ozone, or the combination thereof is disposed within a reaction gas, wherein the reaction gas comprises one or more of hydrogen, nitrogen, or combinations thereof.

15. The method of claim 1, further comprising curing the flowable layer of low-k dielectric material with ultraviolet light.

16. A non-transitory computer readable medium having instructions stored thereon that, when executed, cause a method for making a semiconductor device to be performed, the method comprising:
    etching a metal layer disposed atop a substrate to form one or more metal lines having a top surface, a first side, and a second side;
    depositing a passivation layer atop the top surface, the first side, and the second side to prevent oxygen contact with the one or more metal lines;
    depositing a flowable layer of low-k dielectric material atop the passivation layer in a thickness sufficient to cover the one or more metal lines;
    contacting the flowable layer of low-k dielectric material with oxygen, ozone, or a combination thereof under conditions sufficient to anneal and increase a density of the flowable layer of low-k dielectric material,
    wherein the passivation layer comprises an etch stop material comprising AlN; and
    wherein the method is conducted without a vacuum break.

* * * * *